US010540277B2

(12) United States Patent
Soulie et al.

(10) Patent No.: US 10,540,277 B2
(45) Date of Patent: Jan. 21, 2020

(54) METHOD AND APPARATUS FOR SUPPORTING THE USE OF INTERLEAVED MEMORY REGIONS (71) Applicants: STMICROELECTRONICS (GRENOBLE 2) SAS, Grenoble (FR); STMICROELECTRONICS S.R.L., Agrate Brianza (IT)

(72) Inventors: Michael Soulie, Chirens (FR); Riccardo Locatelli, Fontanil (FR); Valerio Catalano, Meylan (FR); Giuseppe Maruccia, Grenoble (FR); Giuseppe Guarnaccia, Augusta (IT); Raffaele Guarrasi, Grenoble (FR)

(73) Assignees: STMICROELECTRONICS (GRENOBLE 2) SAS, Grenoble (FR); STMICROELECTRONICS S.R.L., Agrate Brianza (IT)

( * ) Notice: Subject to any disclaimer, the term of this patent is extended or adjusted under 35 U.S.C. 154(b) by 875 days.

(21) Appl. No.: 15/026,586

(22) PCT Filed: Oct. 15, 2014

(86) PCT No.: PCT/EP2014/072139
§ 371 (c)(1),
(2) Date: Mar. 31, 2016

(87) PCT Pub. No.: WO2015/055728
PCT Pub. Date: Apr. 23, 2015

(65) Prior Publication Data
US 2016/0246714 A1 Aug. 25, 2016

(30) Foreign Application Priority Data
Oct. 18, 2013 (GB) .................................. 1318476.7

(51) Int. Cl.
G06F 12/06 (2006.01)
G06F 15/78 (2006.01)
G06F 17/50 (2006.01)

(52) U.S. Cl.
CPC ...... *G06F 12/0607* (2013.01); *G06F 15/7825* (2013.01); *G06F 17/5077* (2013.01); *G06F 2212/656* (2013.01)

(58) Field of Classification Search
CPC ............ G06F 12/0607; G06F 17/5077; G06F 15/7825; G06F 13/1647; G06F 2212/656
(Continued)

(56) References Cited

U.S. PATENT DOCUMENTS 6,108,745 A  8/2000 Gupta et al.
2007/0115939 A1  5/2007 Lee et al.
(Continued)

FOREIGN PATENT DOCUMENTS

CN  1060731 A  4/1992
EP  0 481 597 A1  4/1992
GB  2505446 A  3/2014

OTHER PUBLICATIONS

Chinese Search Report, dated Nov. 21, 2017, for Chinese Application No. 2014800538690, 3 pages (with English translation).
(Continued)

*Primary Examiner* — Saif A Alhija
(74) *Attorney, Agent, or Firm* — Seed IP Law Group LLP (57) ABSTRACT A method comprising: receiving a transaction associated with an address and having a transaction destination, said address being in an interleaved region of a memory; determining one of a plurality of destinations for said transaction, different parts of said interleaved memory region being respectively accessible by said plurality of destinations; and associating routing information to said transaction, said
(Continued)

routing information associated with the determined destination.

40 Claims, 8 Drawing Sheets

(58) Field of Classification Search
USPC .............................................................. 703/1
See application file for complete search history.

(56) References Cited

U.S. PATENT DOCUMENTS

2008/0320254 A1* 12/2008 Wingard ............. G06F 12/0607
711/157
2011/0064087 A1    3/2011  Lan et al.
2011/0283042 A1   11/2011  Jeon et al.
2012/0054455 A1    3/2012  Wang et al.

OTHER PUBLICATIONS

International Search Report, dated Mar. 4, 2015, for corresponding International Application No. PCT/EP2014/072139, 4 pages.
Great Britain Search Report, dated Mar. 18, 2014, for corresponding GB Application No. GB1318476.7, 2 pages.
Ghosh et al., "Architecture of Configurable K-way C-access Interleaved Memory," *Process Automation, Control and Computing (PACC), International Conference on. IEEE*, Jul. 2011, 5 pages.

* cited by examiner

METHOD AND APPARATUS FOR SUPPORTING THE USE OF INTERLEAVED MEMORY REGIONS

BACKGROUND

Technical Field

Embodiments relate in particular but not exclusively to a method and apparatus for supporting the use of interleaved memory regions.

Description of the Related Art

A network on chip (NoC) uses packet based communication and a layered definition of the communication. Network on chips provide an interconnect between one or more initiators and their respective targets.

BRIEF SUMMARY

Quality of Service mechanisms are provided in order to arbitrate between requests for access to the network on chip.

According to an aspect, there is provided a method comprising: receiving a transaction associated with an address, the transaction having a transaction destination, said address identifying a location in an interleaved region of a memory; determining one of a plurality of destinations for said transaction, different parts of said interleaved memory region being respectively accessible by said plurality of destinations; associating routing information to said transaction, said routing information associated with the determined one of the plurality of destinations; and accessing a memory location associated with said address.

The determined one of the plurality of destinations may be different from the transaction destination.

The determined one of the plurality of destinations may be the same as the transaction destination.

The memory may comprise a plurality of interleaved memory regions.

Each interleaved memory region may be defined by at least one of a start address and an end address.

Each interleaved memory region may be defined by a step size representing a size of an address range that is contiguously mapped.

Each interleaved memory region size may be an integer multiplied by said step size multiplied by a number of said destinations.

The determining of one of said plurality of destinations may be dependent on one or more of the address, the step size, the number of destinations, and an offset.

The determining one of said plurality of destinations may comprise calculating the determined one of the plurality of destinations as:

(the address[log 2(MCChS)−1, log 2(the step size)]+
the offset)modulo the number of destinations, where MCChS is a maximum common channel size.

The determining one of said plurality of destinations may comprise, if the number of destinations is a power of 2, calculating the determined on of the plurality of destinations as:

(the address[log 2(the step size)+log 2(the number of
destinations)−1, log 2(the step size)]+the offset)
Modulo the number of destinations.

Each interleaved memory region may be considered as part of a respective channel from a source of said transaction.

Each destination of the plurality of destinations may comprise a channel.

Each destination of the plurality of destinations may comprise a memory controller.

The method may comprise using the address associated with the transaction at said determined destination to access said memory location associated with said address.

The method may comprise receiving a transaction, and determining if an address associated with said transaction is in an interleaved memory region.

The method may comprise routing said transaction through an interconnect using said routing information.

The interconnect may be a network on chip.

A computer aided design tool may be arranged to configure a controller for an apparatus so that in use said controller performs the method as described above.

According to another aspect, there is provided an apparatus comprising an input configured to receive a transaction associated with an address, the address having a transaction destination, said address identifying a location in an interleaved region of a memory, and a controller, said controller configured to: determine one of a plurality of destinations for said transaction, different parts of said interleaved memory region being respectively accessible by said plurality of destinations; associate routing information to said transaction, said routing information associated with the determined one of the plurality of destinations; and access a memory location associated with said address.

The determined one of the plurality of destinations may be from the transaction destination.

The determined one of the plurality of destinations may be the same as the transaction destination.

The memory may comprise a plurality of interleaved memory regions.

Each interleaved memory region may be defined by at least one of a start address and an end address.

Each interleaved memory region may be defined by a step size representing a size of an address range that is contiguously mapped.

Each interleaved memory region size may be an integer multiplied by said step size multiplied by a number of said destinations.

The controller may be configured to determine the one of said plurality of destinations dependent on one or more of the address, the step size, the number of destinations and an offset.

The controller may be configured to determine the one of said plurality of destinations as:

(the address[log 2(MCChS)−1, log 2(the step size)]+
the offset) modulo the number of destinations, where MCChS is a maximum common channel size.

The controller may be configured to determine the one of said plurality of destinations, when the number of destinations is a power of 2, as:

(the address[log 2(the step size)+log 2(the number of
destinations)−1, log 2(the step size)]+the offset)
modulo the number of destinations Each interleaved memory region may be viewed as part of a respective channel from a source of said transaction.

Each destination of the plurality of destinations may each comprise a channel.

Each destination of the plurality of destinations may comprise memory controllers.

The input may be configured to receive a transaction, and said controller may be configured to determine if an address associated with said transaction is in an interleaved memory region.

The apparatus may comprise said plurality of destinations, said destinations using the address associated with the transaction at said determined destination to access said memory location associated with said address.

The apparatus may comprise an interconnect configured to route said transaction through said interconnect using said routing information.

The interconnect may be a network on chip.

A network interface may comprise an apparatus as described above.

An integrated circuit or die may comprise an apparatus as described above.

According to another aspect, there is provided a computer aided design tool configured to perform a method to configure a device, the method comprising: generating computer code to represent a default version of the device; modifying the computer code to configure the device to receive a transaction associated with an address, the transaction having a transaction destination, said address identifying a location in an interleaved region of a memory; modifying the computer code to configure the device to determine one of a plurality of destinations for said transaction, different parts of said interleaved memory region being respectively accessible by said plurality of destinations; modifying the computer code to associate routing information to said transaction, said routing information associated with the determined one of the plurality of destinations; and modifying the computer code to configure the device to access a memory location associated with said address.

The determined one of the plurality of destinations may be different from the transaction destination.

The determined one of the plurality of destinations may be the same as the transaction destination.

The memory may comprise a plurality of interleaved memory regions. The determination of the one of said plurality of destinations may be dependent on one or more of the address, the step size, the number of destinations, and an offset.

The determining one of said plurality of destinations may comprise modifying the computer code to configure the device to calculate the determined one of the plurality of destinations as: (the address[log 2(MCChS)−1, log 2(the step size)]+the offset) modulo the number of destinations, where MCChS is a maximum common channel size.

The determining one of said plurality of destinations may comprise modifying the computer code to configure the device to calculate, if the number of destinations is a power of 2, the determined one of the plurality of destinations as: (the address[log 2(the step size)+log 2(the number of destinations)−1, log 2(the step size)]+the offset) modulo the number of destinations.

The channel information may comprise at least one of channel position, channel number, interleaving step size, and quality of service.

Generating computer code to represent the default version of the device may include generating the device with: at least two network interfaces; at least two routers; at least two links configured to pass packet-based communications, the at least two links coupling the at least two network interfaces through the at least two routers.

The default version of the device may be a network interface.

The default version of the device may be an integrated circuit.

BRIEF DESCRIPTION OF THE SEVERAL VIEWS OF THE DRAWINGS

For a better understanding of some embodiments, reference is now made by way of example only to the accompany drawings. Non-limiting and non-exhaustive embodiments are described with reference to the following drawings, wherein like labels refer to like parts throughout the various views unless otherwise specified. One or more embodiments are described hereinafter with reference to the accompanying drawings in which.

DETAILED DESCRIPTION

Figure 1:
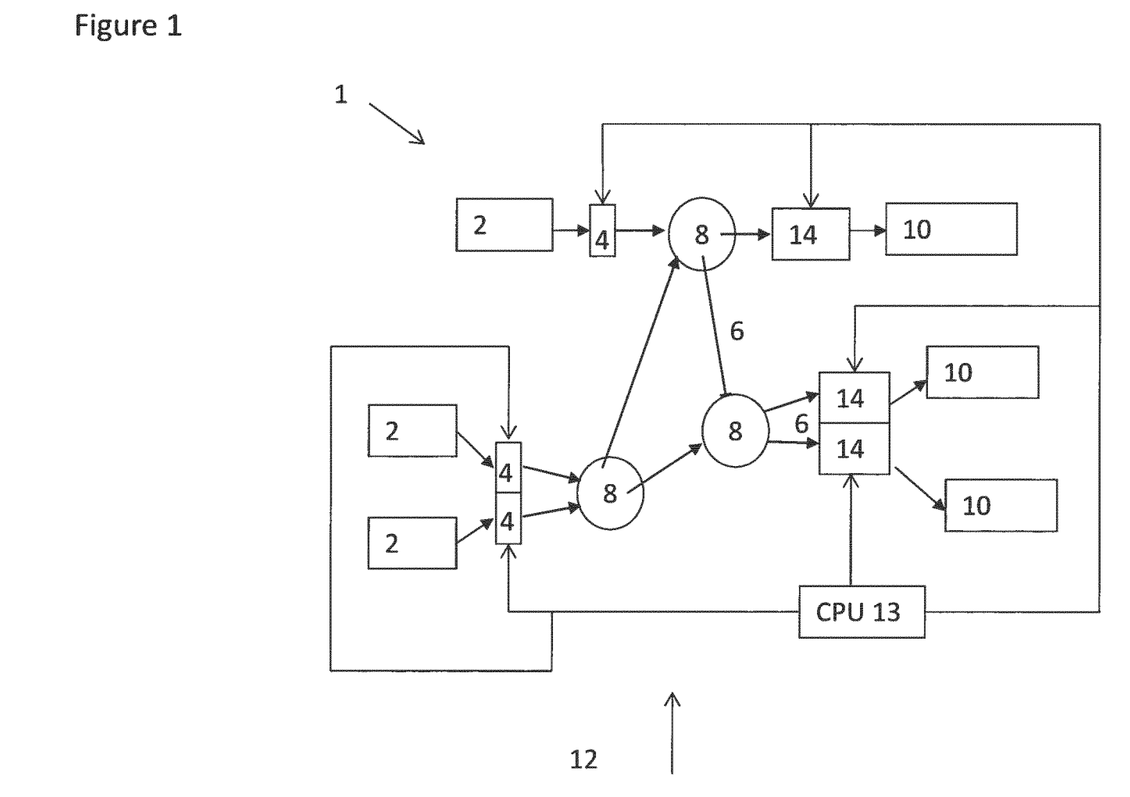
FIG. 1 shows schematically part of an electronics device in which some embodiments may be provided.

Reference is made to FIG. 1 which schematically shows part of an electronics device 1 in which embodiments may be provided. At least part of the device shown in FIG. 1 may be provided in an integrated circuit. In some embodiments, all of the elements shown in FIG. 1 may be provided in an integrated circuit. In alternative embodiments, the arrangement shown in FIG. 1 may be provided by two or more integrated circuits. Some embodiments may be implemented by one or more dies. The one or more dies may be packaged in the same or different packages. Some of the components of FIG. 1 may be provided outside of an integrated circuit or die.

The device 1 comprises a number of traffic initiators (also known as a master or source) 2 which are configured to communicate with various targets (or destinations) 10 and vice versa. The initiators may be any suitable device and by way of example may be one or more of a CPU (computer processor unit), transport stream processor, decoder, graphics processor, encoder, video display processor and graphics processor. It should be appreciated that these units are by way of example only and any other alternative or additional traffic initiator may be used. In the example shown in FIG. 1, there are three initiators. However, it should be appreciated that this is by way of example only and more or fewer than three initiators may be provided.

By way of example only, the targets may comprise one or more of a flash memory, a peripheral component interconnect (PCI), a double data rate memory (DDR) and an eRAM (embedded random access memory). It should be appreciated that these targets are by way of example only and any other suitable target may alternatively or additionally be used. More or fewer than the number of targets shown may be provided in other embodiments. In the example shown in FIG. 1, three targets are shown. However, it should be appreciated that this is by way of example only and more or fewer than three targets may be provided.

The various initiators and targets are able to communicate via a network on chip NoC 12. The NoC 12 comprises a respective network interface 4 for each of the respective initiators 2. In some embodiments, two or more initiators may share a network interface. In some embodiments, more than one network interface may be provided for a respective initiator. Likewise, a network interface 14 is provided for each of the respective targets. In some embodiments two or more network interfaces may be provided for a respective target. In some embodiments two or more targets may share the same network interface.

The network interfaces 4, 14 are connected to one or more routers 8 via links 6. The routers are connected to each other via links 6. The network on chip shown in FIG. 1 is simplified and shows three routers. In practice, the network on chip may comprise many more than three routers. The topology may be regular, custom or any other suitable topology.

Some embodiments may have an on-chip interconnection which may be organized as a packet-based source routing and switching network-on-chip.

A CPU (computer processing unit) 13 is provided which is coupled to each of the network interfaces. The CPU may be configured to control the programming of the network interfaces.

Embodiments may be used in a wide range of applications. Some embodiments may be used in graphics and/or video applications. These applications may demand a relatively high bandwidth and relatively large memory buffers. Some applications may require two or more DDR memory controllers. In other words two or more channels may be required. Some applications may have security engines provided close to a memory for encryption and may for example use address-based filtering.

Figure 2:
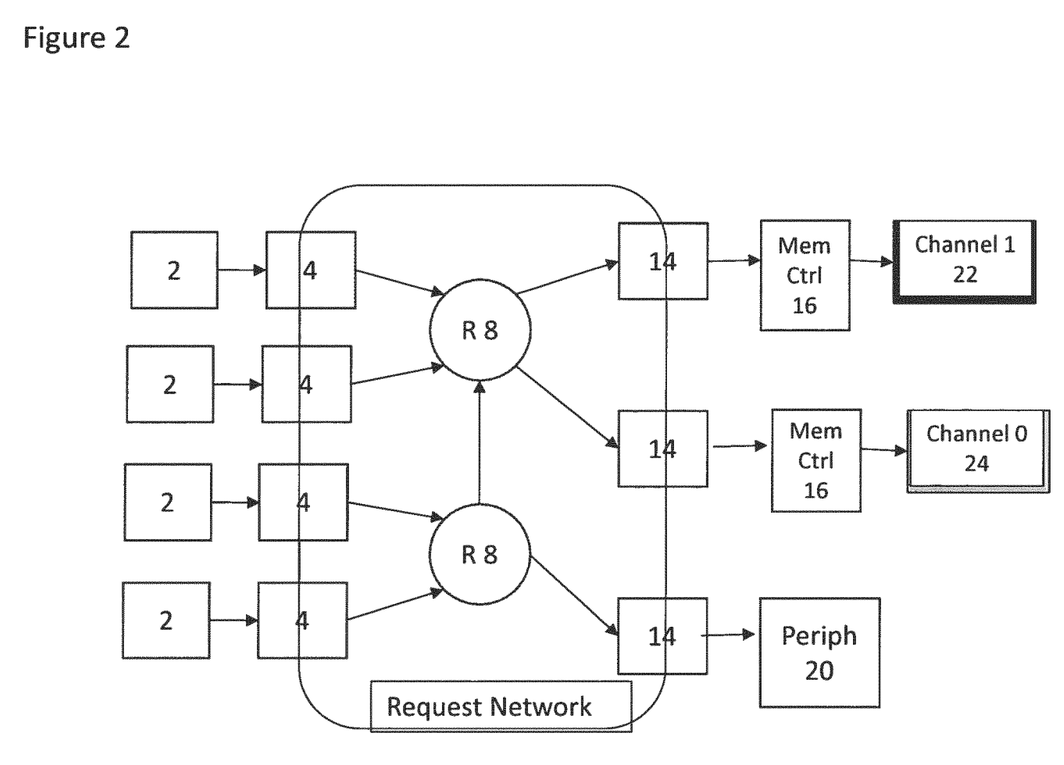
FIG. 2 shows an embodiment with a NoC with two DDRs.

Reference is made to FIG. 2 which schematically shows an arrangement where two double data rate memories (DDRs) are used. In the example shown in FIG. 2 there are four traffic initiators 2. Each traffic initiator 2 is associated with a respective initiator network interface 4. A first memory controller 16 is provided along with a second memory controller 18. The first memory controller is associated with a first channel 22. The second memory controller 18 is associated with a second channel 24. The first channel 22 is associated with a DDR, DDR1 and the second channel is associated with another DDR, DDR0. The memory controllers can be considered to be targets.

Also provided is a peripheral device 20. Each of the first and second memory controllers 16 and 18 as well as the peripheral device 20 has its own target network interface 14. Communication between the initiator network interfaces 4 and the target network interfaces 14 is via the NoC and in particular, via the routers 8 of the NoC.

Figure 3:
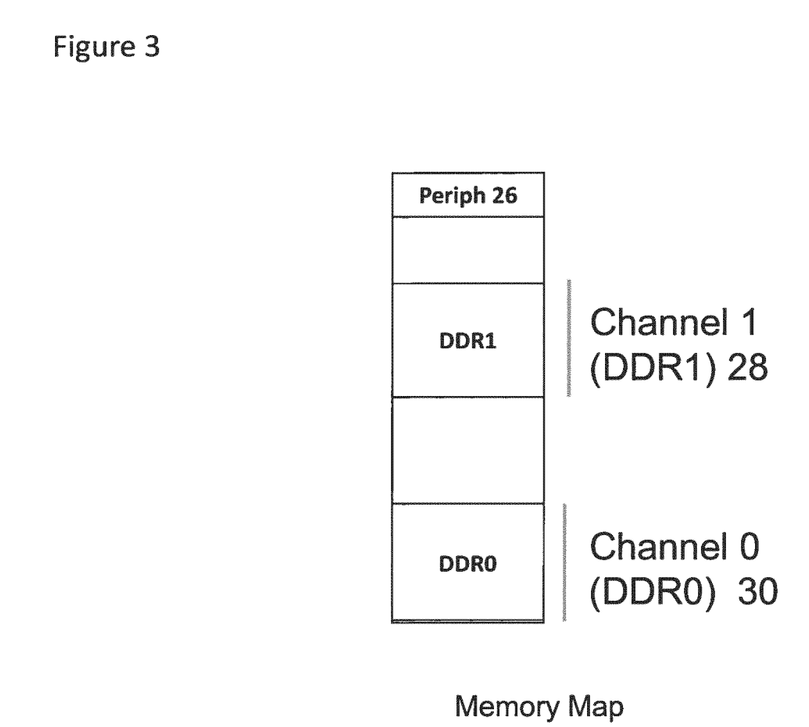
FIG. 3 shows a first memory map.

FIG. 3 shows a first example of a memory map. The first region 26 is associated with the first peripheral device. A second area 28 is for DDR 1 and a third area 30 is assigned in the memory map for DDR0. In this example, channel 1 allows access to DDR1 and channel 0 to DDR0.

Figure 4:
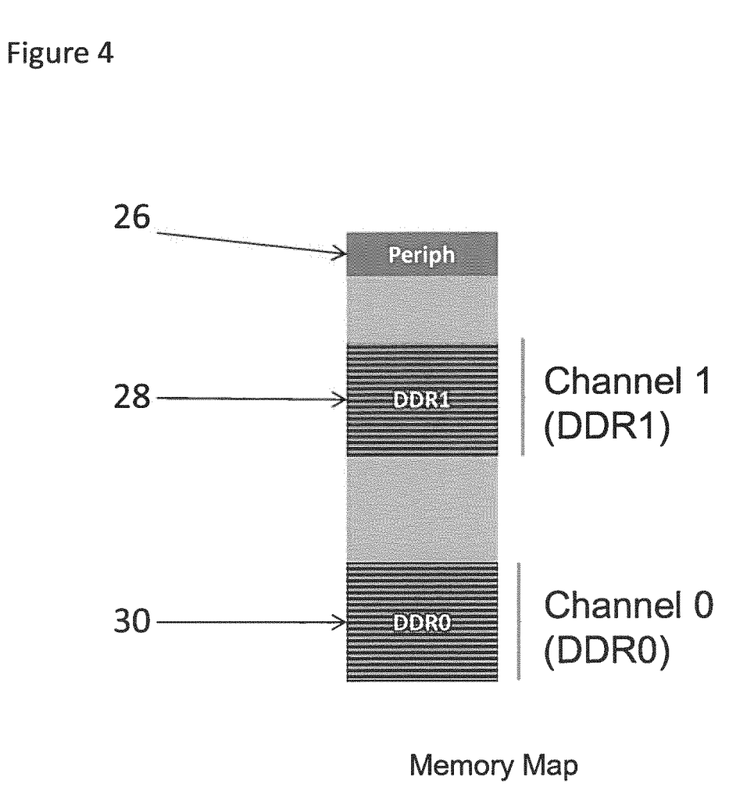
FIG. 4 shows a second memory map.

Reference is made to FIG. 4 which shows a second example of a memory map. In this arrangement, there is a first region allocated to the first peripheral device. The first and second DDRs are interleaved. In other words, alternative memory locations in each DDR are accessed alternatively via the respective channels. Accordingly a first memory region of a DDR is accessed by one channel, the next memory region is accessed via the other channel and so on.

Some embodiments may address one or more of the following.

Application buffers may be allocated in a fixed manner over two or more channels and still provide flexibility.

There is a trend for SoC (system on chip) platforms to become open systems.

The software may need to see a unique memory space in which to allocate entire buffers. Some applications may require relatively large buffers.

Some embodiments may require the memory space to be mapped over two or more channels.

In some embodiments, the load among the channels should be balanced to ensure a good overall SoC performance.

It should be appreciated that in some embodiments, not all parts of the memory channel can be interleaved. In some embodiments, flexibility may be required to reserve a linear memory zone which may enable an efficient SoC integration. Some targets may require a dedicated memory space.

Some embodiments may support memory channels of different sizes.

Some embodiments may provide a low cost implementation. Some embodiments may be compatible with the integration of other system features such as security which may also work at the address level.

It has been suggested that in order to support address interleaving such as shown in FIG. 4 that address bits be manipulated. The address is modified (interleaved) at the interconnect input, that is at the initiator interface. The modified address is used to route the transaction across the NoC. The address is then de-interleaved at the target network interface to provide the original address. This is undesirable. Modifying the address may lead to problems with for example SoC features based on address filtering, for example memory security firewalls.

In embodiments, the NoC may provide support for two or more channels (memory controllers) for accessing a memory. The software may see a unique memory space but the NoC dispatches and balances the traffic towards the two or more memory channels (such as two memory controllers). In embodiments, the NoC address interleaving used allows the offering of unique memory spaces that are automatically mapped among two or more channels balancing the traffic.

In some embodiments, the original address is not changed. This may reduce the system cost. This may be advantageous with security features as the address is not altered. In some embodiments, the routing associated with the address may be changed but the actual address and memory space accessed by that address is not changed.

Some embodiments may support differently size channel memories.

Some embodiments may support interleaved and non-interleaved memory regions.

Figure 5:
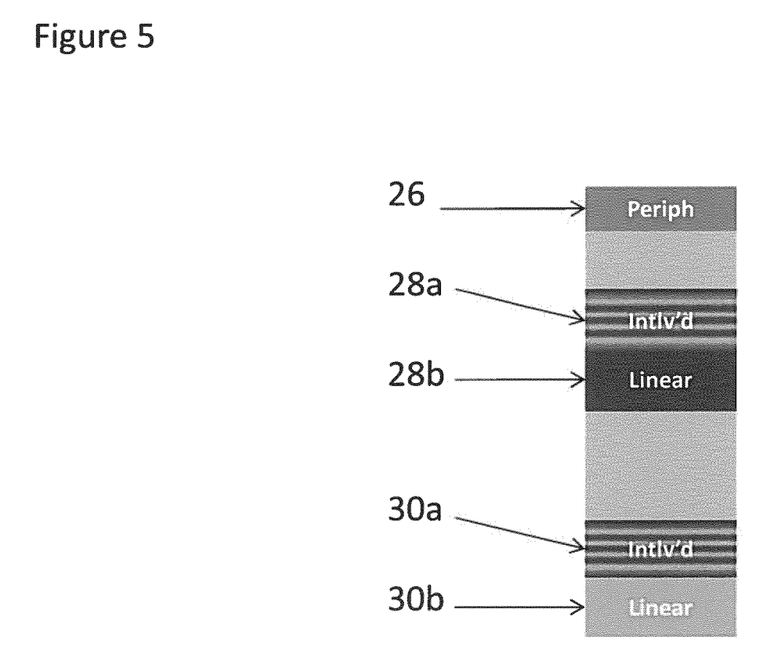
FIG. 5 shows a third memory map.

Reference is made to FIG. 5 which shows an example of a memory map used in some embodiments. The area of the memory referenced 26 is associated with the peripheral device 26. Each DDR is divided into an interleaved part 28a and 30a and a linear part 28b and 30b. The interleaved part is accessed via both channels as discussed previously. However the linear part is accessed only via one of the channels.

By way of example channel 0 is from address 0x00000000 to 0x3FFFFFFF and
channel 1 is from address 0xC0000000 to 0xFFFFFFFF,
1 interleaved memory region set on 2 channels:
interleaved memory region in channel 0 from 0x00000000 to 0x1FFFFFFF;
interleaved memory region in channel 1 from 0xC0000000 to 0xDFFFFFFF.

A channel may be considered as a system target on which address interleaving can apply. By way of example a channel may be a DDR memory controller or any other suitable device. A channel may be considered as a sequence of adjacent contiguous memory ranges (node map entries)

which are (or will be after routing reprogramming) associated to a NoC target network interface.

Channels may be of different sizes. Interleaving may only apply at most on the smallest size among channel sizes or the Maximum Common Channel Size (MCChS)

The number of channels may be a power of two. By way of example only, some embodiments may support interleaving on 2, 4, 8, and 16 channels. However, it should be appreciated that the number of channels can be any value. The interleaving algorithm implementation may be optimized when channels number is a power of 2.

Preferably the channels are mapped to addresses aligned to their size. If the channel size is not a power of two, then the channel may be mapped to addresses aligned to the power of 2 immediately greater than its size, in some embodiments. For example, channels of 750 MB may be mapped to addresses aligned at 1 GB An interleaved memory region (IMR) may be fully and univocally defined by a start address, an end address and an offset value. The offset value ensures that the routing path is to the correct destination. Without the offset, the routing from say a first interleaved region may be confused with the routing from the second interleaved region. The IMR start address and the IMR end address may define a continuous memory region within the channel in the address map. The IMR start address and IMR end address may be programmable through dedicated registers. In some embodiments, only a relevant subset of address bits, for example [MSB:LSB] (most significant bit, least significant bit), of start and end addresses may be used to understand if an access is being done to an interleaved region.

For an IMR set, the above-mentioned MSB may be imposed by the channel of greatest size. In some embodiments, if the greatest channel size is a power of 2, then MSB=log 2 [greatest channel size]−1. If the greatest channel size is not a power of two, then MSB=log 2 [immediately greater power of 2]−1.

Consider the following example. If the greatest channel size is of 256 MB (that is a power of 2), the address MSB considered is log 2[256 MB]−1=27.

If greatest channel is of 768 MB (not a power of 2), address MSB considered is log 2[1024 MB]−1=29.

In some embodiments, the defined minimal IMR size may be 16 MB. Then the above-mentioned LSB may be set to 23.

The offset may be a value used for the NoC interleaving algorithm. This value may not be accessible to a user and may be assigned at configuration time.

All interleaved memory regions IMR providing an interleaved memory region set may comply with the following rules;

The size of the channel interleaved memory region may be the same across all the channels within an interleaved memory region set; and The interleaved memory region may have a start and end address defining a set of interleaved memory regions.

These rules may define the interleaving pattern for each interleaved memory region set.

In some embodiments, the IMR size is a multiple of a step×number of channels.

In an interleaved memory region set IMR Set, the step represents the size of the address range that will be contiguously mapped in a target device.

All the transactions having their address between the interleaved memory region IMR start address and the step value will be routed towards one channel.

All the transactions having their address in the subsequent step address slice will be routed towards the subsequent channel, and so on. If N is the number of channels, then the (N+1)th step address slice is routed to first channel again.

The step may be a power of 2. A minimal value for the step size will depend on the transaction granularity and for example in some embodiments may be 256 bytes.

In embodiments, different routing paths to interleaved channels may be provided while keeping the address unchanged.

Figure 6:
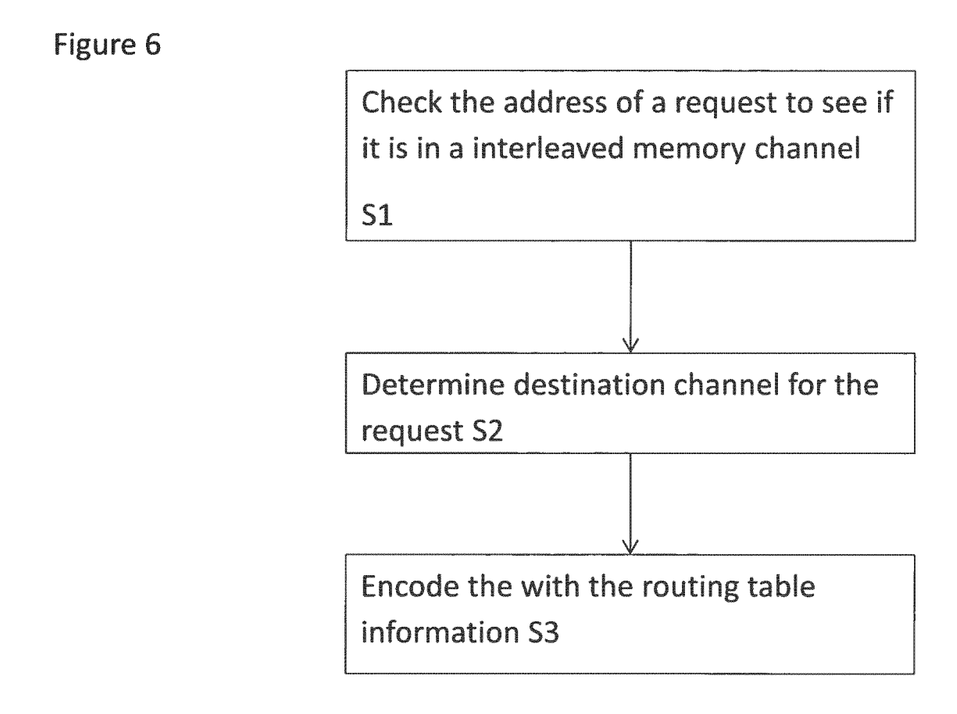
FIG. 6 shows a method flow.

The routing based address Interleaving may be a 3-step process in some embodiments as is illustrated in FIG. 6.

Firstly, in step S1 it is detected that the incoming transaction address is part of an interleaved memory region.

Then in step S2, the interleaved destination channel for this address is determined. For example the determination may be based on the following:

channel=(address[log 2(MCChS)−1, log 2(step)]+ offset) modulo number of channels.

The above determination may be optimized if the number of channels is a power of 2.

channel=(address[log 2(step)+log 2(channel#)−1, log 2(step)]+offset) Modulo number of channels.

This optimization may use fewer bits in the channel computation. It should be appreciated, that this is only one way of determining which channel is used for which interleaved region.

Finally, the corresponding routing path is assigned to this transaction in step S3.

Figure 7:
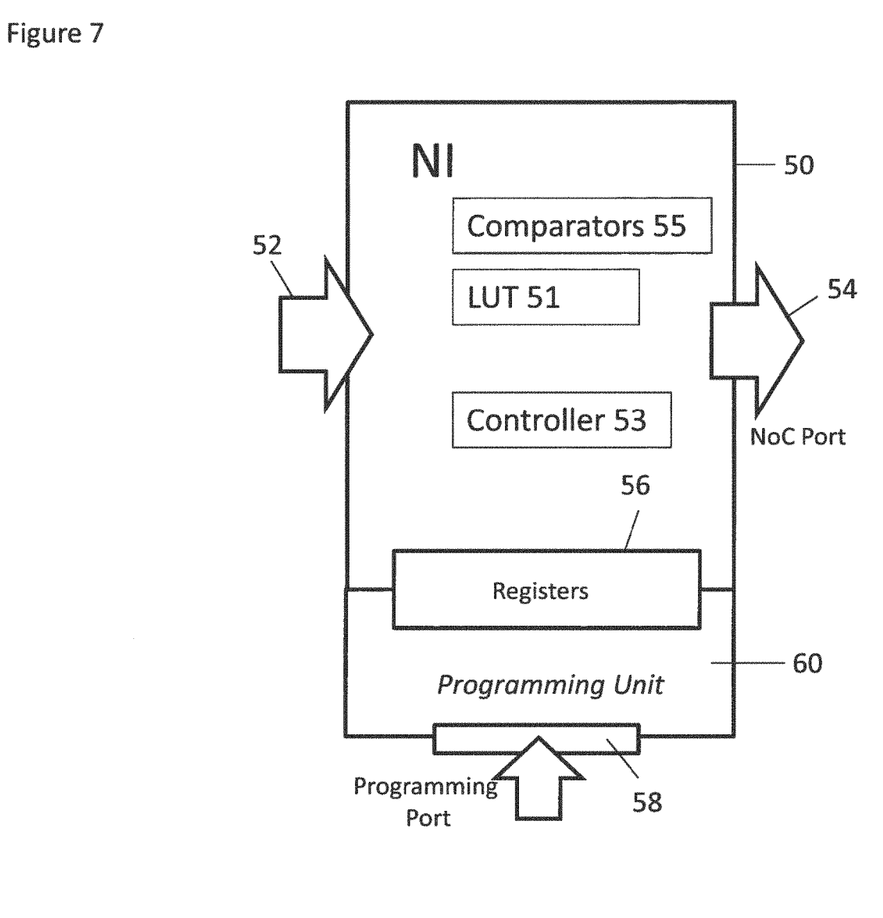
FIG. 7 schematically shows a network interface.

Before describing the method in more detail, reference is made to FIG. 7 which shows a network interface (NI) used to carry out the method. The network interface comprises an input socket 52 from for example a source and an output port 54 to a NoC. The network interface comprises registers 56. The network interface has a programming unit 60 with a programming port 58. This is used to update the programming of the interface if required. The NI has comparators 55 which are used to compare the address in a received transaction to see if that address is in an interleaved region.

The NI also has a look up table which stores routing information for the addresses in the interleaved region. The routing information will define the route to be taken by the packet through the NoC. The routing information will define the routing taken. A first part of the routing information will define the first router. That first part of the routing information is removed by the first router and the next part of the routing information will define the next router and so on until the packet is routed through the network. It should be appreciated that this is by way of example and the routing information may alternatively take any other suitable form.

The NI has a controller 53 which comprises for example computational logic and memory. The controller is configured to carry out the channel computation. The controller may also control the associating of the routing information with the transaction. The controller may be provided by a single functional block or by a plurality of functional blocks. The one or more functional blocks may be discrete functional blocks or part of one or more other blocks. For example part of the controller may be provided by a functional block associated with the look up table.

It should be appreciated, that in other embodiments, the routing information may be obtained other than by a routing table, for example using an algorithm or the like.

The method of FIG. 6 will now be described in more detail. In the first step S1, when an Initiator Network Interface receives a request, the address of the request is compared to the currently activated interleaved channel memory region start address and end address to understand if channel computation is required or not.

If channel computation is not required, the routing information may be retrieved from the current routing table.

If channel computation is required, then the channel is computed in step S2.

In more detail, in step S2, once a request to a currently activated IMR Set is detected, the destination channel for this request is determined. This is based on the offset. As mentioned previously, the offset is a value assigned during configuration to each interleaved channel of the considered IMR Set. The offset may be retrieved from a specific HW structure set at design time. The channel number is the number of channels with which the memory region is interleaved. The channel number may be defined at design time for each IMR set. The step is the interleaving step value for this interleaved memory region. The step may be defined at design time for each IMR Set and may be reprogrammed at runtime through dedicated registers.

The destination channel may be computed using the above definitions.

In more detail, the third step S3 provides the routing path assertion. After the destination channel computation, the final step is to encode the network layer encoder with the correct routing information. The routing information is retrieved from the look up table based on the destination channel computed in Step S2. In some embodiments, a look up table entry may be provided having only routing to a different channel to a default channel associated with a memory region.

If several routing paths are possible for a transaction (because the channel is spread on several node map entries having different routing paths) then a reference routing path is assigned (RIRC). A reference routing path for each IMR may be defined at design time.

In some embodiments, the request packet header may be encoded with the routing table information.

Consider the following example, 0x0000_0000 to 0x3FFF_FFFF is an interleaved area of DDR channel 0 with a step of 4 KB and an offset of 0. 0x4000_0000 to 0x7FFF_FFFF is a non-interleaved area of DDR channel 0. 0x8000_0000 to 0xBFFF_FFFF is an interleaved area of DDR channel 1 with a step of 4 KB and an offset of 1. 0xC000_0000 to 0xFFFF_FFFF is a non-interleaved area of DDR channel 1.

---

An incoming address is 0xA28D_C450.
Address Detection - the incoming address matches interleaved memory region range 0x80000000 to 0xBFFFFFFF of the DDR channel 1.
Channel Computation - number of channels = 2 and step = 4 KB => channel. bit is address [12].
Channel = (address[12] + offset) modulo number of channels.
Channel = (0 + 1) modulo 2.
Channel = 1.
Header Fields Setting - Routing Path to target "Channel 1". The routing does not need to be modified.

---

Consider another example where the first DDR channel is from 0X0000_0000 to 0x3FFF_FFFF, the second DDR channel is from 0X4000_0000 to 0x7FFF_FFFF, and the third DDR channel is from 0x80000000 to 0xBFFFFFFF. All three regions are interleaved with the steps size being 1 MB. The offset for the first region is 0, for the second region 1, and for the third region 2.

---

The incoming address is 0xA28D_C450.
Address Detection - incoming address matches interleaved memory region range 0x80000000 to 0xBFFFFFFF - Channel number 2.
Channel Computation_.
Channel number = 3, MCChS = 1 GB, and step = 1 MB => Address bits considered are address[29:20].
Channel = (address[29:20] + offset) modulo number of channels.
Channel = (552 + 1) mod 3.
Channel = 1.
_Header Fields Setting_Routing Path to target "Channel 1".

---

Thus the original transaction has an address comprised in IMR of the third channel. The address algorithm is then applied to determine the destination channel, resulting in channel number 1. The address has not been modified or altered; it has just been re-routed from channel number 2 to channel number 1.

Consider another example where the first DDR0 is from 0X0000_0000 to 0x3FFF_FFFF, the second DDR1 is from 0X4000_0000 to 0x7FFF_FFFF the third DDR2 is from 0x80000000 to 0xBFFFFFFF and the fourth DDR3 is from 0XC000_0000 to 0xfFFFFFFF. All four regions are interleaved with the steps size being 16 KB. The offset for the first region is 0, for the second region 1, for the third region 2 and for the fourth region 3.

---

Example: the incoming address is 0xA28D_C450.
Address Detection_incoming address matches interleaved memory region range 0x80000000 to 0xBFFFFFFF.
Channel Computation_.
Channel number = 4 and step = 16K => channel bits are address[15;14].
Channel = (address[15;14] + offset)modulo number of channels.
Channel = (3 + 2) mod 4.
Channel = 1.
_Header Fields Setting_Routing Path to target "Channel 1". The routing of this address is modified to go to channel 1 (without interleaving it would have been directed to channel 2).

---

Figure 8:
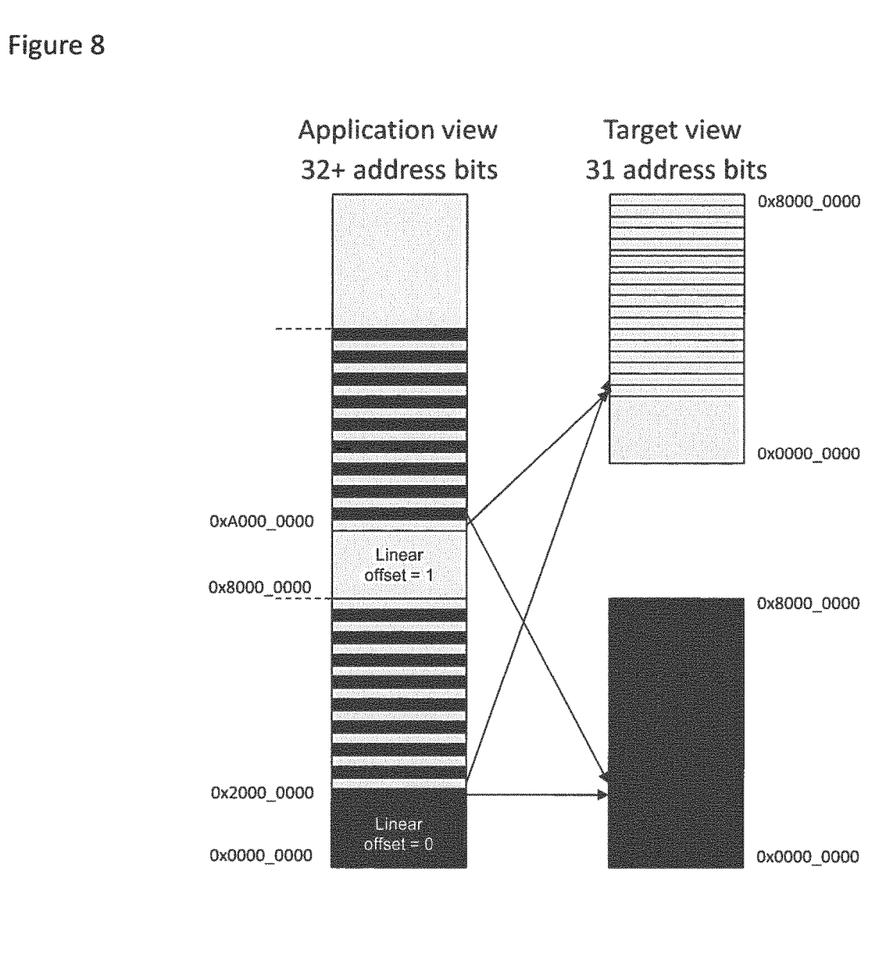
FIG. 8 shows schematically an embodiment.

Reference is made to FIG. 8 which schematically shows two channels each of 2 GB with linear memory regions. The left hand side shows the address space from the perspective of the application. There is a first region from 0x0000_0000 to 0x7FFF_FFFF which represents the first channel from the application view. The offset for this first channel is 0. The linear part of the channel is from 0x0000_ 0000 to 0x1 FFF_FFFF and the interleaved part of the channel is from 0x2000_0000 to 0x7FFF_FFFF with a step size of 4 KB. There is a second region from 0x8000_0000 to 0xFFFF_FFFF which represents the second channel from the application view. The offset for this second channel is 1. The linear part of the channel is from 0x8000_0000 to 0x9FFF_FFFF and the interleaved part of the channel is from 0xA000_0000 to 0xFFFF_FFFF with a step size of 4 KB.

The right side of FIG. 8 shows the channel view in terms of the target view. In other words, the channel to which the address from the application view is routed. This may be the same or different to the channel in the application view. However the address is not modified.

The targets are one or other of the destinations for the packet and may be the memory targets. In this example, the targets are accessed via a node or look up table entry which are referred to as X and Y. The application view can be considered to be the memory map. The different sections of the interleaved memory map alternatively access the look up table entries or nodes X and Y.

The routing table is as below.

| node_num | address range | routing path | interleavable | offset |
|---|---|---|---|---|
| Y | 0xFFFF_FFFF 0x8000_0000 | RP1 | Yes | 1 |
| X | 0x7FFF_FFFF 0x0000_0000 | RP0 | Yes | 0 |

The programming register for interleaving is below. This defines the memory region in which interleaving is found and may include the linear region. In some embodiments, different ranges may be provided for the different interleaved ranges in other embodiments.

| interleaved region | address range | Step |
|---|---|---|
| 0 | 0x7FFF_FFFF 0x2000_0000 | 4 KB |

The table of interleavable targets:

| channel number | node_num |
|---|---|
| 0 | X |
| 1 | Y |

Some embodiments may provide a NoC routing based address interleaving algorithm. It should be appreciated that other embodiments may use any other suitable network.

There may be a unique software allocation view of a two or more channel memory which may have an automatic traffic balance.

Some embodiments may not modify the address. Some embodiments may be compatible with a SoC with security rules based on address filtering.

Some embodiments may have a limited hardware implementation impact. The routing control may be located in an initiator network interfaces. These interfaces may be simple to reprogram during use. These interfaces may alternatively or additionally be programmed in dependence on the application or market for the product without having to carry out a complicated remapping of the memory map.

Some embodiments may be optimized for common cases of 2 and 4 channels.

Some embodiments may support different size channels.

Some embodiments may support linear/interleaved memory regions.

Embodiments may be applied in a wide range of technologies and applications. For example, embodiments may be used in a set top box, a Digital Television (DTV), and an application processor in a multimedia convergence application. Embodiments may be used in communications devices such as mobile phones, smart phones or the like.

Some of the embodiments have been described in relation to a DDR controller. It should be appreciated that this is by way of example only and the target may be any suitable entity. The target may be a different type of memory or any other suitable type of target. For example the memory may be an embedded static random access memory (eSRAM). The target could be any suitable peripheral device and in some embodiments may be a peripheral register access point. Alternative embodiments may use any suitable interconnect instead of the example Network-on-Chip.

Some embodiments may comprise configuring of the device when it is in the CAD (computer aided design) or similar phase. In other words, the device is not a physical device but is represented by computer software, computer code and/or the like. Such a representation may be created by one party and stored on a machine-readable medium for subsequent transfer to another party by some appropriate means.

Whilst this detailed description has set forth some embodiments of the present invention, the appending claims cover other embodiments of the present invention which differ from the described embodiments according to various modifications and improvements. Other applications and configurations may be apparent to the person skilled in the art.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method comprising:
receiving a transaction associated with an address, the transaction having a transaction destination, said address identifying a location in an interleaved region of a memory;
determining one of a plurality of destinations for said transaction, different parts of said interleaved memory region being respectively accessible by said plurality of destinations;
associating routing information to said transaction, said routing information associated with the determined one of the plurality of destinations; and
accessing a memory location associated with said address, wherein said determined one of the plurality of destinations is different from the transaction destination and the method comprises using the address associated with the transaction at said determined destination to access said memory location associated with said address, wherein,
the interleaved memory region is defined by a step size representing a size of an address range that is contiguously mapped;
determining one of said plurality of destinations is dependent on one or more of the address, the step size, the number of destinations and an offset; and
said determining one of said plurality of destinations comprises:
calculating the determined one of the plurality of destinations as:

(the address[log 2(MCChS)−1, log 2(the step size)]+
the offset) modulo the number of destinations,
where MCChS is a maximum common channel
size.

2. The method as claimed in claim 1, wherein said memory comprises a plurality of interleaved memory regions.

3. The method as claimed in claim 1, wherein the interleaved memory region is defined by at least one of a start address and an end address.

4. The method as claimed in claim 1 wherein the interleaved memory region size is an integer multiplied by said step size multiplied by a number of said destinations.

5. A method, comprising:
receiving a transaction associated with an address, the transaction having a transaction destination, said address identifying a location in an interleaved region of a memory;
determining one of a plurality of destinations for said transaction, different parts of said interleaved memory region being respectively accessible by said plurality of destinations;
associating routing information to said transaction, said routing information associated with the determined one of the plurality of destinations; and
accessing a memory location associated with said address, wherein said determined one of the plurality of destinations is different from the transaction destination and the method comprises using the address associated with the transaction at said determined destination to access said memory location associated with said address, wherein,
the interleaved memory region is defined by a step size representing a size of an address range that is contiguously mapped;
determining one of said plurality of destinations is dependent on one or more of the address, the step size, the number of destinations and an offset; and
determining one of said plurality of destinations comprises:
if the number of destinations is a power of 2, calculating the determined one of the plurality of destinations as:

(the address[log 2(the step size)+log 2(the number of destinations)−1, log 2(the step size)]+the offset) modulo the number of destinations.

6. The method as claimed in claim 1, wherein each interleaved memory region is viewed as part of a respective channel from a source of said transaction.

7. The method as claimed in claim 1, wherein each destination of said plurality of destinations comprises a channel.

8. The method as claimed in claim 1, wherein each destination of said plurality of destinations comprises a memory controller.

9. The method as claimed in claim 1, comprising receiving a transaction, and determining if an address associated with said transaction is in an interleaved memory region.

10. The method as claimed in claim 1, comprising:
routing said transaction through an interconnect using said routing information.

11. The method as claimed in claim 10, wherein said interconnect is a network on chip.

12. An apparatus, comprising:
an input configured to receive a transaction associated with an address, the address having a transaction destination, said address identifying a location in an interleaved region of a memory; and
a controller, said controller configured to:
determine one of a plurality of destinations for said transaction, different parts of said interleaved memory region being respectively accessible by said plurality of destinations;
associate routing information to said transaction, said routing information associated with the determined one of the plurality of destinations; and
access a memory location associated with said address, wherein said determined one of the plurality of destinations is different from the transaction destination and said one of the plurality of destinations is arranged to use the address associated with the transaction at said determined destination to access said memory location associated with said address, wherein,
the interleaved memory region is defined by a step size representing a size of an address range that is contiguously mapped;
said controller is configured to determine the one of said plurality of destinations dependent on one or more of the address, the step size, the number of destinations and an offset; and
said controller is configured to determine the one of said plurality of destinations, when the number of destinations is a power of 2, as:

(the address[log 2(the step size)+log 2(the number of destinations)−1, log 2(the step size)]+the offset) modulo the number of destinations.

13. The apparatus as claimed in claim 12, wherein said determined one of the plurality of destinations is identical to the transaction destination.

14. The apparatus as claimed in claim 12, wherein said memory comprises a plurality of interleaved memory regions.

15. The apparatus as claimed in claim 12, wherein the interleaved memory region is defined by at least one of a start address and an end address.

16. The apparatus as claimed in claim 12, wherein the interleaved memory region size is an integer multiplied by said step size multiplied by a number of said destinations.

17. An apparatus, comprising:
an input configured to receive a transaction associated with an address, the address having a transaction destination, said address identifying a location in an interleaved region of a memory; and
a controller, said controller configured to:
determine one of a plurality of destinations for said transaction, different parts of said interleaved memory region being respectively accessible by said plurality of destinations;
associate routing information to said transaction, said routing information associated with the determined one of the plurality of destinations; and
access a memory location associated with said address, wherein said determined one of the plurality of destinations is different from the transaction destination and said one of the plurality of destinations is arranged to use the address associated with the transaction at said determined destination to access said memory location associated with said address, wherein,
the interleaved memory region is defined by a step size representing a size of an address range that is contiguously mapped;
said controller is configured to determine the one of said plurality of destinations dependent on one or more of the address, the step size, the number of destinations and an offset; and
said controller is configured to determine the one of said plurality of destinations as:

(the address[log 2(MCChS)−1, log 2(the step size)]+ the offset) modulo the number of destinations, where MCChS is a maximum common channel size.

18. The apparatus as claimed in claim 12, wherein each interleaved memory region is viewed as part of a respective channel from a source of said transaction.

19. The apparatus as claimed in claim 12, wherein each destination of said plurality of destinations comprises a channel.

20. The apparatus as claimed in claim 12, wherein each destination of said plurality of destinations comprises a memory controller.

21. The apparatus as claimed in claim 12, wherein said controller is configured to determine if an address associated with said transaction is in an interleaved memory region.

22. The apparatus as claimed in claim 12, wherein said apparatus is an interconnect configured to route said transaction through said interconnect using said routing information.

23. An apparatus as claimed in claim 22, wherein said interconnect is a network on chip.

24. An apparatus as claimed in claim 12, wherein said apparatus is arranged for operation within a network interface.

25. An apparatus as claimed in claim 12, wherein said apparatus is formed on a die of an integrated circuit.

26. A computer aided design tool configured to perform a method to configure a device, the method comprising:
generating computer code to represent a default version of the device;
modifying the computer code to configure the device to receive a transaction associated with an address, the transaction having a transaction destination, said address identifying a location in an interleaved region of a memory;
modifying the computer code to configure the device to determine one of a plurality of destinations for said transaction, different parts of said interleaved memory region being respectively accessible by said plurality of destinations;
modifying the computer code to associate routing information to said transaction, said routing information associated with the determined one of the plurality of destinations;
modifying the computer code to configure the device to access a memory location associated with said address, wherein said determined one of the plurality of destinations is different from the transaction destination and the accessing the memory location comprises using the address associated with the transaction at said determined destination to access said memory location associated with said address; and
modifying the computer code to configure the device to calculate the determined one of the plurality of destinations as:

(the address[log 2(MCChS)−1, log 2(a step size)]+an offset) modulo the number of destinations, where MCChS is a maximum common channel size.

27. The computer aided design tool of claim 26 configured to perform the method to configure the device, wherein said memory comprises a plurality of interleaved memory regions.

28. A computer aided design tool configured to perform a method to configure a device, the method comprising:
generating computer code to represent a default version of the device;
modifying the computer code to configure the device to receive a transaction associated with an address, the transaction having a transaction destination, said address identifying a location in an interleaved region of a memory;
modifying the computer code to configure the device to determine one of a plurality of destinations for said transaction, different parts of said interleaved memory region being respectively accessible by said plurality of destinations;
modifying the computer code to associate routing information to said transaction, said routing information associated with the determined one of the plurality of destinations;
modifying the computer code to configure the device to access a memory location associated with said address, wherein said determined one of the plurality of destinations is different from the transaction destination and the accessing the memory location comprises using the address associated with the transaction at said determined destination to access said memory location associated with said address; and
modifying the computer code to configure the device to calculate, if the number of destinations is a power of 2, the determined one of the plurality of destinations as:

(the address[log 2(a step size)+log 2(the number of destinations)−1, log 2(the step size)]+an offset) modulo the number of destinations.

29. The computer aided design tool of claim 26 configured to perform the method to configure the device, wherein said channel information comprises at least one of channel position, channel number, interleaving step size, and quality of service.

30. The computer aided design tool of claim 26 configured to perform the method to configure the device, wherein generating computer code to represent the default version of the device includes generating the device with:
at least two network interfaces;
at least two routers;
at least two links configured to pass packet-based communications, the at least two links coupling the at least two network interfaces through the at least two routers.

31. The computer aided design tool of claim 26 configured to perform the method to configure the device, wherein said default version of the device is a network interface.

32. The computer aided design tool of claim 26 configured to perform the method to configure the device, wherein said default version of the device is an integrated circuit.

33. The apparatus as claimed in claim 17, wherein said determined one of the plurality of destinations is identical to the transaction destination.

34. The apparatus as claimed in claim 17, wherein said memory comprises a plurality of interleaved memory regions.

35. The apparatus as claimed in claim 17, wherein the interleaved memory region is defined by at least one of a start address and an end address.

36. The apparatus as claimed in claim 17, wherein the interleaved memory region size is an integer multiplied by said step size multiplied by a number of said destinations.

37. The apparatus as claimed in claim 17, wherein each destination of said plurality of destinations comprises a channel.

38. The apparatus as claimed in claim 17, wherein each destination of said plurality of destinations comprises a memory controller.

39. The apparatus as claimed in claim 17, wherein said apparatus is an interconnect configured to route said transaction through said interconnect using said routing information.

40. The apparatus as claimed in claim 17, wherein said controller is configured to determine if an address associated with said transaction is in an interleaved memory region.

* * * * *